US010386505B2

(12) United States Patent
Yoshida et al.

(10) Patent No.: US 10,386,505 B2
(45) Date of Patent: Aug. 20, 2019

(54) SCINTILLATOR, SCINTILLATOR PANEL, RADIATION DETECTOR AND METHOD OF MANUFACTURING SCINTILLATOR

(71) Applicant: Toshiba Electron Tubes & Devices Co., Ltd., Otawara-shi (JP)

(72) Inventors: Atsuya Yoshida, Utsunomiya (JP); Hiroshi Horiuchi, Otawara (JP)

(73) Assignee: CANON ELECTRON TUBES & DEVICES CO., LTD., Otawara-shi (JP)

( * ) Notice: Subject to any disclaimer, the term of this patent is extended or adjusted under 35 U.S.C. 154(b) by 0 days.

(21) Appl. No.: 15/643,909

(22) Filed: Jul. 7, 2017

(65) Prior Publication Data

US 2018/0011209 A1 Jan. 11, 2018

(30) Foreign Application Priority Data

Jul. 8, 2016 (JP) ................................. 2016-135862

(51) Int. Cl.

| | |
|---|---|
| ***G01T 1/202*** | (2006.01) |
| ***C30B 25/02*** | (2006.01) |
| ***C30B 25/16*** | (2006.01) |
| ***C30B 25/18*** | (2006.01) |
| ***G01T 1/20*** | (2006.01) |
| ***G01T 1/208*** | (2006.01) |
| ***C30B 29/12*** | (2006.01) |
| ***C30B 29/60*** | (2006.01) |

(52) U.S. Cl.

CPC .......... *G01T 1/2023* (2013.01); *C30B 25/025* (2013.01); *C30B 25/16* (2013.01); *C30B 25/18* (2013.01); *C30B 29/12* (2013.01); *C30B 29/605* (2013.01); *G01T 1/201* (2013.01); *G01T 1/2002* (2013.01); *G01T 1/208* (2013.01)

(58) Field of Classification Search

CPC ....... C30B 25/025; C30B 25/16; C30B 25/18; G01T 1/2002; G01T 1/201; G01T 1/2023; G01T 1/208

See application file for complete search history.

(56) References Cited

U.S. PATENT DOCUMENTS

2005/0089142 A1* 4/2005 Marek .................. C09K 11/616 378/98.8
2007/0051896 A1* 3/2007 Okada .................. G01T 1/2018 250/370.11

(Continued)

FOREIGN PATENT DOCUMENTS

JP 10-223163 8/1998

*Primary Examiner* — Marcus H Taningco
(74) *Attorney, Agent, or Firm* — Oblon, McClelland, Maier & Neustadt, L.L.P.

(57) ABSTRACT

According to one embodiment, a scintillator includes a first layer provided on a surface of a substrate and including thallium activated cesium iodide; and a second layer provided on the first layer and including thallium activated cesium iodide. The second layer includes crystals having a [001] orientation partially diverted from a direction perpendicular to the surface of the substrate. Half width at half maximum of a frequency distribution curve of an angle between the direction perpendicular to the surface of the substrate and the [001] orientation, which is obtained by measuring the angle using EBSD method, is 2.4 degree or less.

15 Claims, 7 Drawing Sheets

15

51

(56) References Cited

U.S. PATENT DOCUMENTS

| | | | | |
|---|---|---|---|---|
| 2007/0158573 | A1* | 7/2007 | Deych | G01T 1/2018 250/370.11 |
| 2012/0187298 | A1* | 7/2012 | Sasaki | H01L 27/14663 250/361 R |
| 2012/0205544 | A1* | 8/2012 | Nakatsugawa | G01T 1/242 250/367 |
| 2012/0298876 | A1* | 11/2012 | Kaneko | G01T 1/202 250/366 |
| 2012/0312999 | A1* | 12/2012 | Oike | G01T 1/202 250/367 |
| 2013/0026377 | A1* | 1/2013 | Ichimura | G01T 1/202 250/367 |
| 2013/0048866 | A1* | 2/2013 | Nishino | G01T 1/202 250/366 |
| 2013/0153775 | A1* | 6/2013 | Nomura | G01T 1/2006 250/366 |
| 2013/0187054 | A1* | 7/2013 | Ishii | G01T 1/2006 250/367 |
| 2014/0084167 | A1* | 3/2014 | Ohashi | G01T 1/202 250/361 R |
| 2014/0284486 | A1* | 9/2014 | Inoue | G01T 1/202 250/367 |
| 2014/0353513 | A1* | 12/2014 | Partain | G01T 1/2018 250/366 |

* cited by examiner

SCINTILLATOR, SCINTILLATOR PANEL, RADIATION DETECTOR AND METHOD OF MANUFACTURING SCINTILLATOR

CROSS-REFERENCE TO RELATED APPLICATIONS

This application is based upon and claims the benefit of priority from Japanese Patent Application No. 2016-135862, filed on Jul. 8, 2016; the entire contents of which are incorporated herein by reference.

FIELD

Embodiments relate to a scintillator, a scintillator panel, a radiation detector, and a method of manufacturing a scintillator.

BACKGROUND

A scintillator provided in a scintillator panel or a radiation detector preferably includes columnar crystals. The scintillator including a columnar crystal has both a function of converting radiation into fluorescence (e.g. visible light) and a function of transmitting generated light (i.e. acting as a light guide).

That is, the columnar crystal acts as a transmission path of the converted light. Thus, there are some technical proposals for enhancing the light guide effect by providing a layer of the columnar crystals having a small diameter on a side close to a substrate of the scintillator. When the layer of the columnar crystals having a small diameter is provided on the side close to the substrate of the scintillator, it is possible to suppress a disorder of crystal orientation in the vicinity of the substrate.

However, suppressing a disorder of crystal orientation has not been considered on a top side of the layer of columnar crystals having a small diameter. When the disorder of crystal orientation is large on the top side of the layer of the columnar crystals having a small diameter, there may be coalescence between adjacent columnar crystals, which blocks or scatters the transmission of light, and induces the degradation of resolution characteristics. That is, it may be difficult to improve the light guide effect, when the disorder of crystal orientation is enlarged on the top side of the layer of columnar crystals having a small diameter. Thus, there has been a demand for developing a scintillator capable of improving the light guide effect.

DETAILED DESCRIPTION

Figure 1:
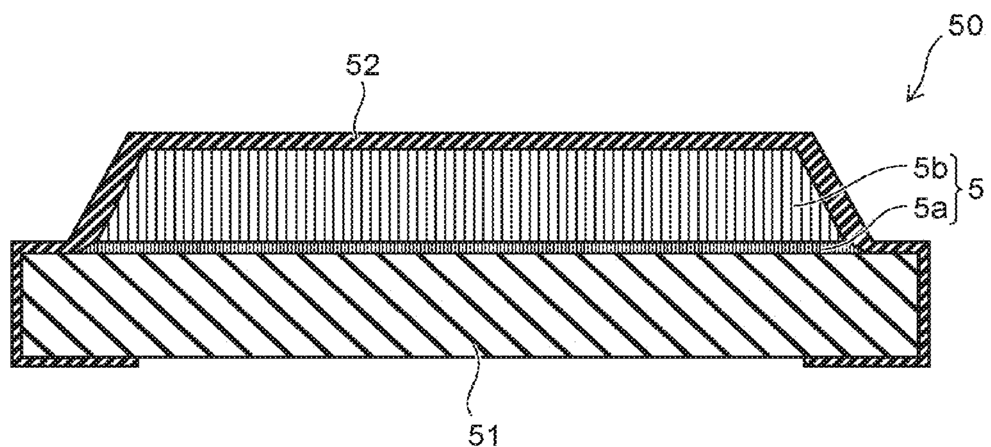
FIG. 1 is a schematic cross-sectional view illustrating a scintillator panel according to an embodiment.

According to one embodiment, a scintillator includes a first layer provided on a. surface of a substrate and including thallium activated cesium iodide; and a second layer provided on the first layer and including thallium activated cesium iodide. The second layer includes crystals having a [001] orientation partially diverted from a direction perpendicular to the surface of the substrate. Half width at half maximum of a frequency distribution curve of an angle between the direction perpendicular to the surface of the substrate and the [001] orientation, which is obtained by measuring the angle using EBSD method, is 2.4 degree or less.

Embodiments will be described below as an example with reference to the drawings. In the respective drawings, the same components are denoted by the same reference numerals, and the detailed description thereof will be omitted appropriately.

A scintillator according to the embodiment may be applied to various types of radiation such as gamma ray other than X-ray. Here, an example case is described, where the X-ray is used as a representative radiation. Accordingly, the following embodiment can be applied to other case by replacing "X-ray" with "other radiation".

(Scintillator and Scintillator Panel)

FIG. 1 is a schematic cross-sectional view illustrating a scintillator panel 50 according to an embodiment.

Figure 2:
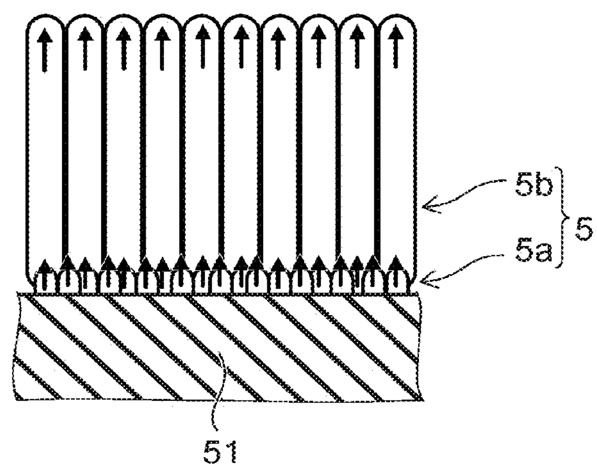
FIG. 2 is a schematic cross-sectional view illustrating a scintillator according to the embodiment.

FIG. 2 is a schematic cross-sectional view illustrating a scintillator 5 according to the embodiment. It should be noted that arrows in the drawing show the [001] orientation. The scintillator panel 50 is provided with a substrate 51, a moisture-proof body 52, and the scintillator 5.

The substrate 51 has a plate-like shape. The substrate 51 may include a plurality of prepregs stacked. The substrate 51 is transparent for X-rays. The substrate 51 can be formed, for example, from carbon fiber reinforced plastic (CFRP). The substrate 51 has a planar surface not limited to the particular shape. The planar surface of the substrate 51 may have, for example, a rectangle shape.

The moisture-proof body 52 is provided to suppress characteristic deterioration of the scintillator 5 due to the water vapor contained in air. The moisture-proof body 52 has a film-like shape and is provided so as to cover the scintillator 5. The moisture-proof body 52 may be formed from material having a light-transmitting property and a low moisture permeability coefficient. The moisture-proof body 52 may be formed, for example, from polyparaxylylene.

Moreover, it is also possible to provide a reflection layer (not shown) so as to cover the scintillator 5. The reflective layer is provided to improve the sensitivity characteristics by enhancing utilization efficiency of fluorescence. The reflective layer may be made of resin containing light scattering particles such as titanium oxide ($TiO_2$). When the reflective layer is provided, the moisture-proof body 52 is provided so as to cover the reflective layer.

The scintillator 5 is provided on a surface of the substrate 51. The scintillator 5 converts the incident X-rays into fluorescence (e.g. visible light). The scintillator 5 includes thallium-activated cesium iodide (CsI: Tl).

There are some scintillators that include sodium-activated cesium iodide (CsI: Na). The sensitivity characteristics may be deteriorated in a scintillator that includes sodium-activated cesium iodide, when such a scintillator is provided in an apparatus used in the atmosphere, such as the scintillator panel 50 and an X-ray detector 1 (see FIG. 10).

When high luminescent efficiency can be obtained with the scintillator 5 including thallium doped cesium iodide, it is possible to improve the sensitivity characteristics. Moreover, when fluorescence can be obtained with a peak wavelength of about 550 nm with the scintillator 5 including thallium doped cesium iodide, photoelectric conversion in a photoelectric conversion element 2*b*1 described later (see FIG. 10) becomes more efficient.

As described later, the heat treatment of the first layer 5*a* can be performed at lower temperature, when the thallium concentration in the first layer 5*a* before the heat treatment is high. However, when the second layer 5*b* is formed on the first layer 5*a* that has higher thallium concentration, coalescence of columnar crystals easily occurs in the second layer 5*b*.

Then, the thallium concentration can be adjusted during the heat treatment of the first layer 5*a*, since the vapor pressure of thallium is higher than the vapor pressure of cesium iodide. That is, it is possible to achieve thallium concentration within an appropriate range by heating in the heat treatment, despite being under the initial condition of higher thallium concentration in the first layer 5.

When using the scintillator that includes sodium-activated cesium iodide, the sodium concentration cannot be adjusted by the heat treatment, since the vapor pressure of sodium is equivalent to the vapor pressure of cesium iodide. Thus, the scintillator 5 is provided with thallium-activated cesium iodide.

As shown in FIGS. 1 and 2, the scintillator 5 includes a first layer 5*a* and a second layer 5*b*. The first layer 5*a* is provided on one surface of the substrate 51. The first layer 5*a* includes a plurality of columnar crystals. The first layer 5*a* contains thallium-activated cesium iodide. The thallium concentration in the first layer 5*a* is higher than the thallium concentration in the second layer 5*b*. The thallium concentration (i.e. the thallium concentration after the heat treatment described later) is 3 wt % or less in the first layer 5*a*. As will be described later, when the thallium concentration in the first layer 5*a* is 3 wt % or less, the coalescence of columnar crystals or the abnormal growth (e.g. branched growth in place of columnar growth) are unlikely generated in the second layer 5*b*. When the thallium concentration in the first layer 5*a* is 2 wt % or less, the coalescence of the columnar crystals or the abnormal growth is less likely to occur in the second layer 5*b*.

Moreover, since the first layer 5*a* is subjected to the heat treatment as described later, there may be coarsening in the columnar crystals. When the coarsening takes place, optical crosstalk easily occurs in the columnar crystals. Thus, in order to improve the light guide effect, the first layer 5*a* in which the coarsening easily occurs has a thickness preferably as thin as possible. The first layer 5*a* may have a thickness of several μm or less, preferably 3 μm or less.

The second layer 5*b* is provided on the first layer 5*a*. The second layer 5*b* includes a plurality of columnar crystals.

The second layer 5*b* contains thallium activated cesium iodide. The thallium concentration in the second layer 5*b* can be 0.05 wt % or more. When the thallium concentration is 0.05 wt % or more, it is possible to emit fluorescence having a peak wavelength of about 550 nm. The columnar crystals may have a diameter of about 3 μm to 10 μm at the outermost surface.

It should be noted that the scintillator 5 may have a thickness of, for example, about 600 μm.

Here, in order to improve the resolution characteristics of the X-ray detector 1, it is preferable to make the light generated at the light emitting point inside the scintillator 5 propagate in a direction perpendicular to the surface of the substrate, i.e. the light receiving surface of the photoelectric conversion element 2*b*1. However, the light emitted from the light emitting point propagates in a random direction not related to the incident direction of X-rays or the crystal orientation. Thus, the emitted light is desired to be confined in the columnar crystal so that the light propagates under multi-reflection at an interface between the outer peripheral surface of the columnar crystal and outside air. However, there may be a part of light leaked outside from the columnar crystal, which reaches adjacent columnar crystals, since complete reflection does not occur at the interface. When such light leakage occurs many times, there may be a case where the leaked light propagates through a plurality of columnar crystals, and reaches a photoelectric conversion element 2*b*1 located at a position shifted from the light emitting point. This may occur in a scintillator that have an ideal fiber plate structure in which columnar crystals have a cylindrical shape or a polygonal columnar shape, and have a gap of $\lambda/2$ width or more (here, $\lambda$ is the wavelength of emitted light) between adjacent columnar crystals. When a columnar crystal having shorter length or a smaller gap between adjacent columnar crystals is included, the light may reach a photoelectric conversion element 2*b*1 located at a further separated position.

Thus, it is desired for the scintillator 5 to include a plurality of columnar crystals grown in the film thickness direction keeping a constant diameter of a columnar crystal and a constant gap between adjacent columnar crystals. And or, it is preferable to minimize differences from the desired columnar crystals.

Figure 3:
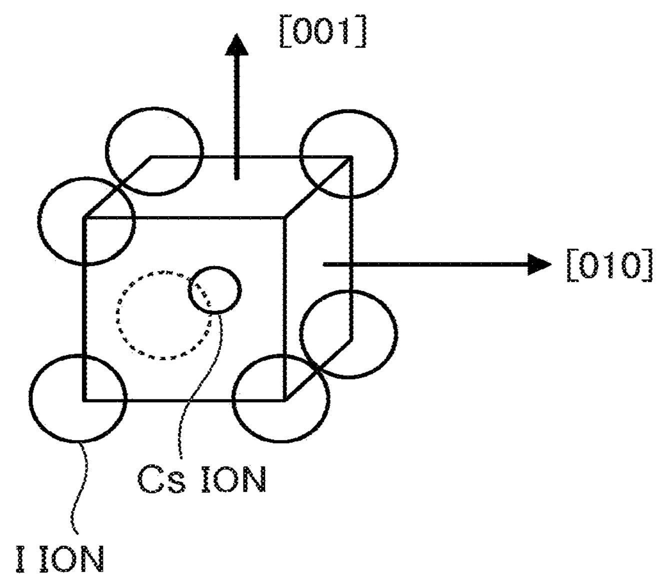
FIG. 3 is a schematic view illustrating a unit cell in a columnar crystal.

FIG. 3 is a schematic view illustrating a unit cell of the columnar crystals.

A columnar crystal of cesium iodide is the CsCl type crystal. As shown in FIG. 3, Cs ion is disposed in a unit cell having a cubic structure, and I ions are disposed at eight corners of the unit cell respectively. When the scintillator 5 is formed using a vacuum deposition method, a plurality of unit cells are aligned in a vertical direction and a horizontal direction on the substrate 51 (e.g. an array substrate 1, see FIG. 10), so that the scintillator 5 has the fiber plate structure.

Figure 4:
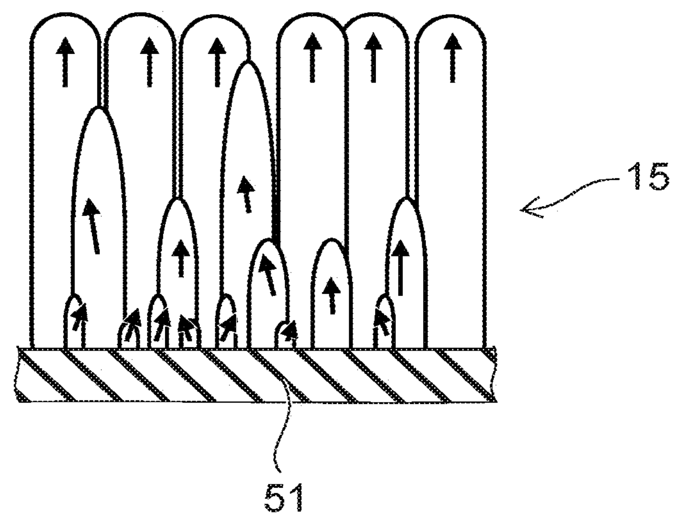
FIG. 4 is a schematic cross-sectional view illustrating a scintillator according to a comparative example.

FIG. 4 is a schematic cross-sectional view illustrating a scintillator 15 according to a comparative example. It should be noted that the arrows in the drawing show the [001] direction.

FIG. 4 shows a case where a plurality of columnar crystals corresponding to the second layer 5*b* are directly provided on the substrate 51 without the first layer 5*a*.

As shown in FIG. 4, when a plurality of columnar crystals are directly provided on the substrate 51, a scintillator having the desired fiber plate structure described above cannot be obtained. The conceivable origin of this is variations in the crystal orientation of the columnar crystals during the vacuum deposition.

When a plurality of columnar crystals are directly deposited on the substrate 51, a deviation amount of the [001]

direction from the direction perpendicular to the surface of the substrate 51 widely varies at the initial stage of growth. This is caused by the misfit between the material of the substrate 51 and the material of the scintillator 15. And the misfit means, the difference of an atomic arrangement and an interatomic distance between the surface of the substrate 51 and the bottom surface of the scintillator 15. When the crystal orientations in the vicinity of the interface between the scintillator 15 and the substrate 51 are measured using the X-ray diffraction method, it is found that almost [110] direction from the direction perpendicular to the surface of the substrate made up majority at many measurement points. This means that there are many columnar crystals having [001] orientation deviated by 45° from the direction perpendicular to the surface of the substrate 51 in the initial stage of growth.

As the columnar crystal grows, the [001] orientation of the columnar crystals tends to gradually approach in the direction perpendicular to the surface of the substrate 51. That is, when columnar crystals are grown by the vacuum deposition method, the respective crystal grains have a property to extend in the [001] direction. When the crystal orientation of the columnar crystals is not aligned in the [001] direction at the initial stage of growth, the columnar crystals start to extend toward the [001] direction with the crystal orientation not aligned in the [001] direction. Thereby, a columnar crystal may be combined with the adjacent columnar crystals having different growth directions, and the one merged into the other. For example, when there are many columnar crystals having [001] orientation deviated by 45° from the direction perpendicular to the surface of the substrate 51 at the initial stage of growth, the columnar crystals tend to be grown in a direction deviated by 45° from the direction perpendicular to the surface of the substrate 51. Thus, the coalescence of columnar crystals is likely to occur. When such coalescence occurs repeatedly, the columnar crystals become coarse.

As described above, a columnar crystal acts as a transmission path of light converted from the X-ray. When the columnar crystal includes a coalescent surface acting as an optical barrier, the light scattering may occur and make the light propagate in a direction deviated from the direction perpendicular to the surface of the substrate 51. When the light propagates in a direction deviated from the direction perpendicular to the surface of the substrate 51, the resolution characteristics may be deteriorated.

Figure 5:
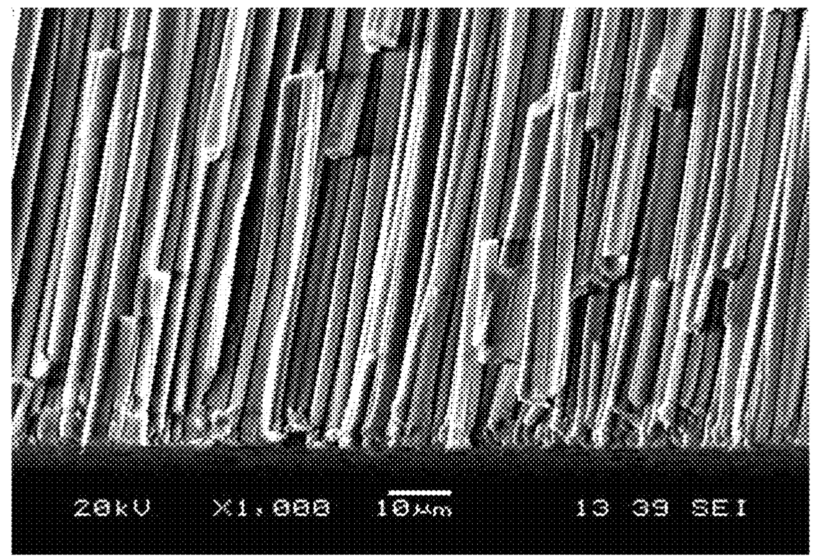
FIG. 5 is a scanning electron microscope image showing a second layer according to the embodiment.

FIG. 5 is a scanning electron microscope image showing a second layer 5*b* according to the embodiment.

That is, FIG. 5 shows a case where the second layer 5*b* is provided on the first layer 5*a* having an appropriate thallium concentration. It should be noted that the concentration of thallium is 2 wt % in the first layer 5*a* shown in FIG. 5.

Figure 6:
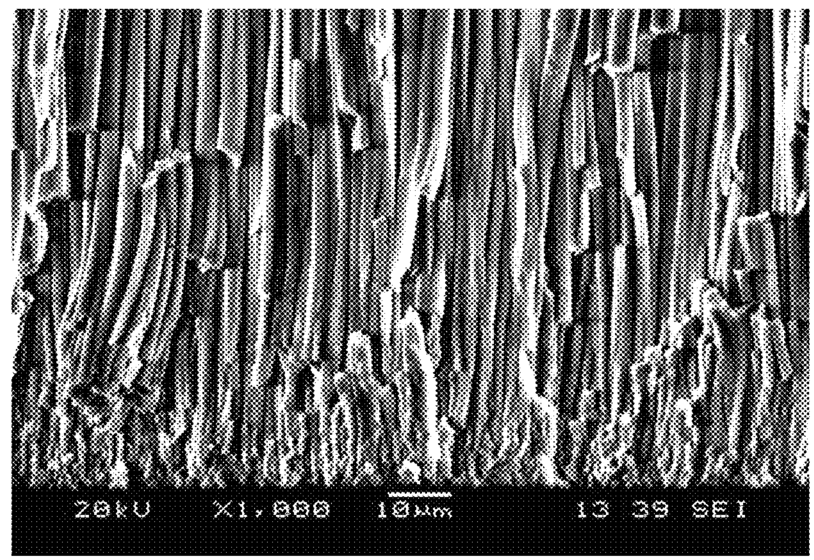
FIG. 6 is a scanning electron microscope image showing a plurality of columnar crystals included in a scintillator according to the comparative example.

FIG. 6 is a scanning electron microscope image showing a plurality of columnar crystals included in the scintillator 15 according to the comparative example.

That is, FIG. 6 shows a case where a plurality of columnar crystals are directly provided on the substrate 51 without the first layer 5*a* having the appropriate thallium concentration.

It is found in FIG. 5 that when the first layer 5*a* is provided with the appropriate thallium concentration, the coalescence of columnar crystals can be suppressed to occur in the second layer 5*b*. Thus, it is possible to improve the light guide effect.

In contrast, as can be seen in FIG. 6, when the first layer 5*a* having the appropriate thallium concentration is not provided, the coalescence of columnar crystals is likely to occur.

Figure 7A:
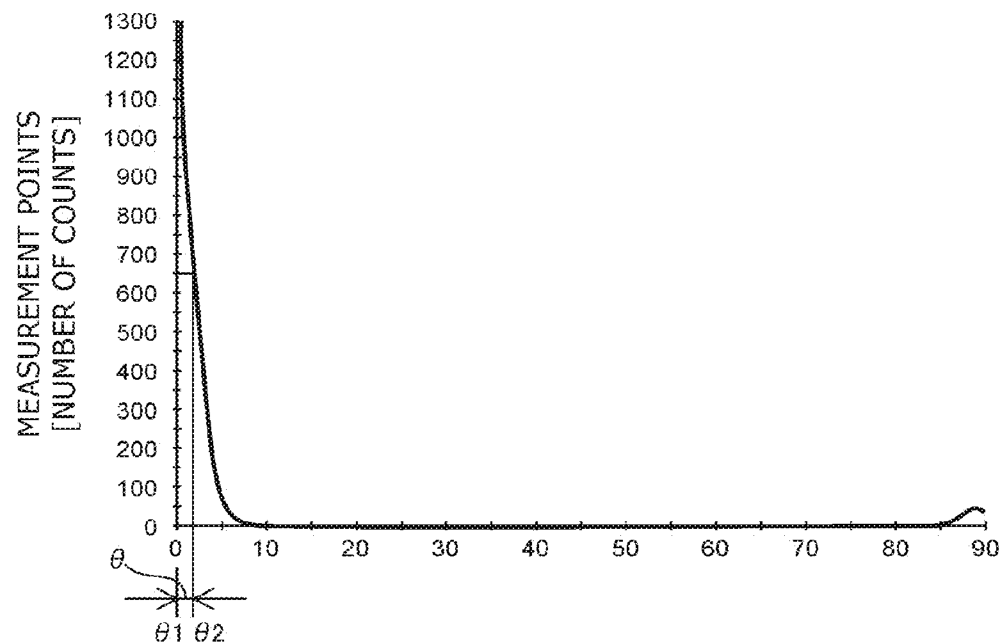
FIGS. 7A and 7B are graph diagrams showing deviations of [001] orientation in the second layer according to the embodiment.
Figure 7B:
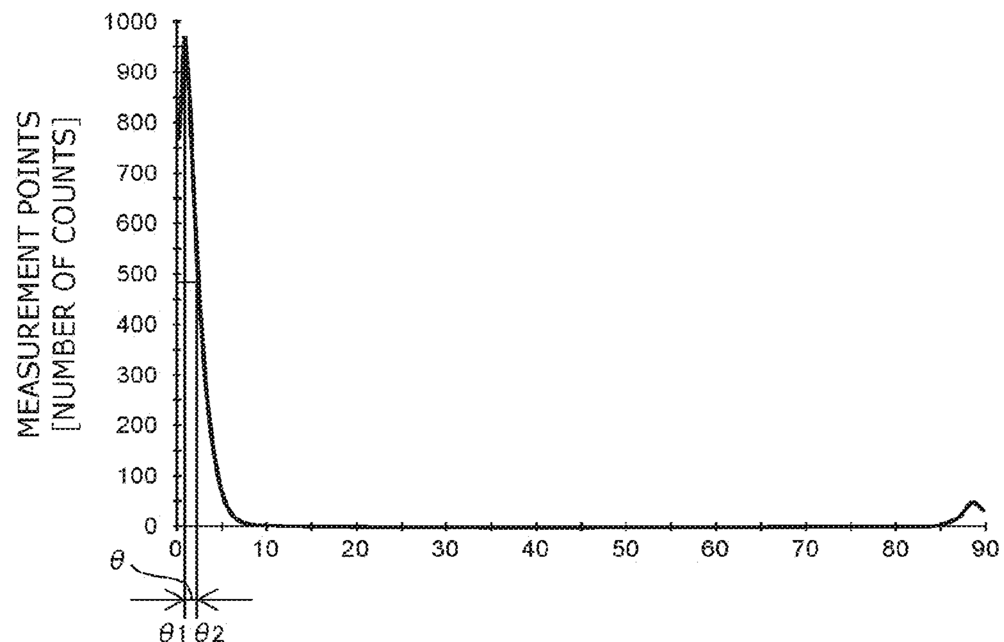

FIGS. 7A and 7B are graph diagrams illustrating the deviation of the [001] direction in the second layer 5*b* according to the embodiment.

Figure 8A:
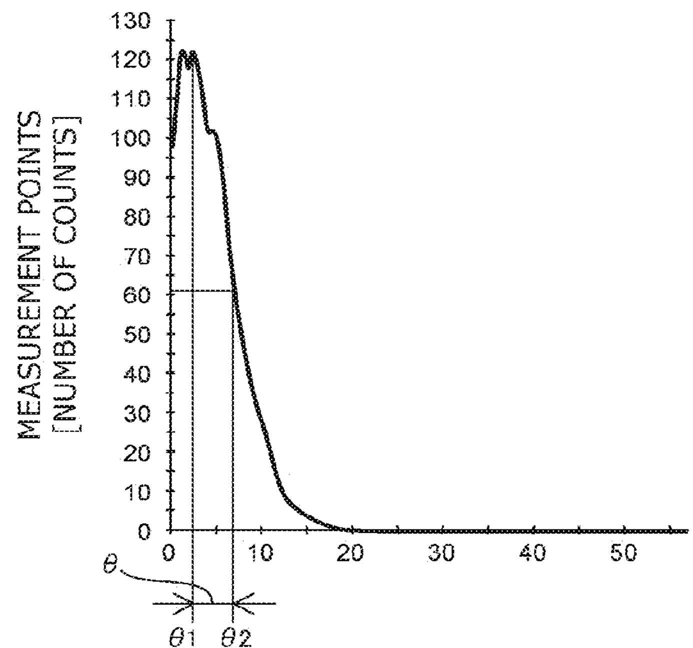
FIGS. 8A and 8B are graph diagrams showing deviations of [001] orientation in the plurality of columnar crystals included in a scintillator according to the comparative example.

FIGS. 8A and B are graph diagrams illustrating the deviation of the [001] direction in the plurality of columnar crystals included in the scintillator 15 according to the comparative example.

Figure 8B:
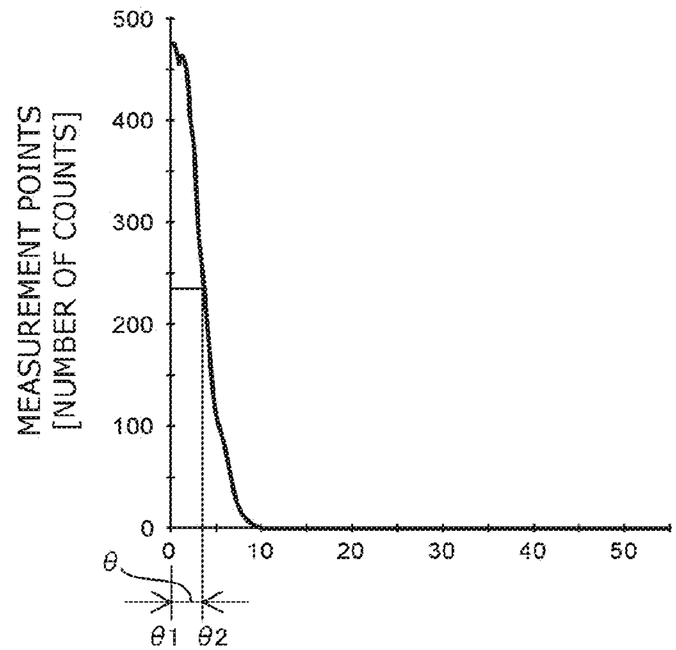

The crystal orientations shown in FIGS. 7A, 7B, 8A, and 8B are measured by EBSD (Electron Backscattered Diffraction) method. In FIGS. 7A and 7B, shown are the frequency distribution curves of measured angles using the EBSD method between the direction perpendicular to the surface of the substrate 51 and the [001] orientation of crystals included in the second layer 5*b*. In FIGS. 8A and 8B, shown are the frequency distribution curve of measured angles using the EBSD method between the direction perpendicular to the surface of the substrate 51 and the [001] direction in the plurality of columnar crystals included in the scintillator 15.

In FIGS. 7A and 8A, shown are the results of the measurement performed at a position 50 μm above the surface of the substrate 51.

In FIGS. 7B and 8B, shown are the results of the measurement performed at a position 50 μm below the top end of the scintillator 5 (and scintillator 15).

In the EBSD method, for example, the crystal orientations are obtained over the whole measurement surface of crystal by irradiating the crystal surface with an electron beam at an angle tilted by 70° from the direction perpendicular to the crystal surface, and analyzing the backscattering diffraction pattern obtained by the image detector. Since the electron beam can be scanned two-dimensionally on the crystal surface, it is possible to map the crystal orientations by obtaining a crystal orientation data in a minute part along the crystal surface.

In the measurement, the CsI crystal (i.e. the scintillator) is cut by a plane perpendicular to the surface of the substrate 51, and the incident direction of the electron beam is set as close as possible to a perpendicular to the surface of the substrate 51. A distribution of angles (i.e. a distribution of deviation amounts) between the direction perpendicular to the surface of the substrate 51 and the [001] direction at the respective measurement points is obtained from the mapping image obtained at this time. When the [001] orientation is coincident with the direction perpendicular to the surface of the substrate 51, the deviation amount is "0°".

The frequency distribution curve is obtained by identifying the [001] direction at a number of measurement points over the entire cross section of the CsI crystal or a part of the cross section, and making histogram based on the collected data with a horizontal axis representing the deviation angle and a vertical axis representing the number of measurement points. The frequency distribution curve is also called a pole plot.

Whether or not the [001] orientation is aligned in a direction perpendicular to the surface of the substrate 51, in the wide view of a region of interest, can be identified based on the shape of the frequency distribution curve. For example, it is possible to evaluate a deviation of the [001] direction using the width (e.g. the half width at half maximum) of the frequency distribution curve, or the ratio of the number of measurement points to the total number of the measurement points, where the number of measurement points corresponds to an angle deviated by 3° or more from the angle $\theta 1$ (hereinafter referred to as the peak angle $\theta 1$) at which the number of measurement points is maximum.

As can be seen in FIGS. 7A, 7B, 8A, and 8B, the width of the frequency distribution curve is narrower in FIGS. 7A and 7B. When the first layer 5*a* is provided with the appropriate thallium concentration, it is possible at more measurement points to make the angle between the direction perpendicular to the surface of the substrate 51 and the [001] direction closer to 0°. That is, it is possible to align the [001] orientation in the direction perpendicular to the surface of the substrate 51. When the [001] orientation is aligned in the direction perpendicular to the surface of the substrate 51, it is possible to improve the light guide effect by suppressing the coalescence of the columnar crystals.

It is preferable to evaluate the width of the power distribution curve (i.e. the variation of crystal orientation) based on the peak angle θ1.

For example, the variation in crystal orientations can be evaluated based on the difference θ between the peak angle θ1 and the angle θ2 at which the number of measurement points is half the maximum value. In this case, the smaller the difference θ between the peak angle θ1 and the angle θ2 at which the number of measurement points is half the maximum value, the more the extending direction of the columnar crystals is aligned. When the extending direction of the columnar crystals is aligned, it is possible to improve the light guide effect by suppressing the coalescence of the columnar crystals.

In FIGS. 7A and 7B, the difference θ between the peak angle θ1 and the angle θ2 at which the number of measurement points is half the maximum value is 2.4° or less.

In FIGS. 8A and 8B, the difference θ between the peak angle θ1 and the angle θ2 at which the number of measurement points is half the maximum value is about 7°.

Thus, it is found that the coalescence of the columnar crystals can be effectively suppressed by making the difference θ not more than 2.4° between the peak angle θ1 and the angle θ2 at which the number of measurement points is half of the maximum value.

Also, it is possible to evaluate the deviation of the [001] direction based on the peak angle θ1.

For example, the peak angle θ1 is 2° in FIG. 8A, indicating that many of columnar crystals are inclined by 2° with respect to the direction perpendicular to the surface of the substrate 51. In the case of FIG. 7A, the peak angle θ1 is 0°. This indicates that many of columnar crystals extend in the direction perpendicular to the surface of the substrate 51. Thus, it is possible to improve the light guide effect by suppressing the coalescence of the columnar crystals.

Here, when using the scintillator 5 according to the embodiment, it is possible to alleviate the ghost phenomenon.

The scintillator 5 including thallium activated cesium iodide may induce so-called the ghost phenomenon (also referred to as the burn-in phenomenon, or the memory effect, etc.) depending on conditions in use. The ghost phenomenon may occur when the subject is irradiated multiple times with the X-ray. For example, there is a case where a dull image generated by the first irradiation of X-ray appears to be overlapped with an image obtained by the second irradiation of X-ray. Such an effect is called a ghost phenomenon. Alternatively, it is sometimes called a memory effect, since the information due to the first X-ray irradiation is maintained until the second X-ray irradiation.

It should be noted that the ghost phenomenon is distinguished from afterimages or afterglow referring to long-lived emission that occurs after the X-ray irradiation.

The source of the ghost phenomenon is positive and negative charges which are generated by X-ray energy at the time of the first irradiation and localized in the scintillator. Part of the electric charges are gradually released as heat or light (i.e. afterglow) from the scintillator by the recombination of positive and negative charges without doing anything to the scintillator. However, when part of the charges remain until the second X-ray irradiation, a certain amount of additional light emission triggered by X-ray energy of the second X-ray irradiation (i.e. input energy) is released at the same time with the light emission by the second X-ray irradiation. Since the additional light emission is mixed with the light emission by the second X-ray irradiation used for the diagnosis, the mixture light thereof reaches the photoelectric conversion element 2*b*1, and is rendered in the diagnostic image that includes an image of the additional light emission mixed with an image of the light emission by the second X-ray irradiation.

The ghost phenomenon appears more significantly depending on the input energy of the first X-ray irradiation, that is, when the signal amount from the photoelectric conversion unit 2*b* (i.e. pixel) becomes larger depending on the first X-ray irradiation. Moreover, the correlation with a plurality of factors, such as time interval between the first irradiation and the second irradiation, and input energy variation at the second X-ray irradiation, i.e. unevenness of signal amount, may cause the ghost phenomenon. Then, it is possible to perform image correction by subtracting the ghost image using the formula obtained by formulating these factors.

Moreover, the ghost phenomenon is caused under the influence of the temperature of the scintillator between the first irradiation and the second irradiation, the energy characteristic of the scintillator depending on the X-ray tube voltage at the first irradiation (i.e. the relationship between the sensitivity and the X-ray tube voltage), or other unpredictable factor. Thus, the entire ghost image might not be always eliminated by the image correction. There may be a case where the ghost image is not completely eliminated by performing the image correction in software approach. Accordingly, it is desirable to use a scintillator in which the ghost phenomenon is suppressed as much as possible.

It is possible to use two indices for evaluating suppression of the ghost phenomenon. One is a ghost component ratio of sensitivity (hereinafter referred to as sensitivity ghost) in an image obtained by a second irradiation immediately after a first irradiation (for example, after 30 seconds or 60 seconds). The other is referred in the specification to as a residual ratio of sensitivity ghost, which is defined as a second sensitivity ghost divided by a first sensitivity ghost. Here, the first sensitivity ghost is in an image obtained by a second irradiation performed at a first predetermined time elapsing after a first irradiation (for example, after 60 seconds), and the second sensitivity ghost is in an image obtained by a third irradiation performed at a second predetermined time elapsing after the first irradiation (for example, after 300 seconds).

The sensitivity ghost represents a probability of charges remaining in the scintillator until next irradiation without the recombination accompanying with light emission, wherein the charges are generated in the scintillator by X-ray irradiation. The residual rate of sensitivity ghost represents a probability of re-emission of light by the charges remaining in the scintillator or re-emission of the charges from the scintillator through the relaxation process.

Increasing the thallium concentration in the scintillator including thallium activated cesium iodide is one manner of suppressing the ghost phenomenon. For example, the sensitivity ghost and the residual rate of sensitivity ghost tend to decrease as the thallium concentration increases. Thus, it is possible to suppress the ghost phenomenon by adjusting the thallium concentration in the scintillator.

It should be noted that the sensitivity decreases by the X-ray irradiation as the thallium concentration is increased in the scintillator. Unlike most other alkali halide crystals, almost no color center is formed by X-ray irradiation in a cesium iodide crystal not containing additives. However, as thallium is added and the thallium concentration is increased, the sensitivity reduction appears to be remarkable by the X-ray irradiation in long-term. This is induced by the defects formed by the X-ray irradiation, in which a thallium ion positioned at the center thereof acts as the color center absorbing light, and thus, the light absorption coefficient increases as the thallium concentration increases.

When the sensitivity of the X-ray detector in the diagnostic apparatus decreases as being repeatedly used, the calibration is frequently performed for maintaining the image quality at a constant level. Moreover, it is necessary to increase the irradiation amount of X-ray when the reduction of sensitivity becomes significant. Consequently, the continuous use of the X-ray detector may be limited by the quantitative restriction of X-ray irradiation to the object, i.e. the human body. Thus, the product life is shortened. As a result, the maintenance cost becomes high in the medical image diagnostic apparatus, which includes the X-ray detector provided with the scintillator of the high thallium concentration.

As described above, when the thallium concentration of the scintillator is taken as a parameter, there is a trade-off relationship between the ghost phenomenon suppression and the X-ray resistance, and thus, there is a demand for a technology resolving both at the same time.

The light emission in the scintillator is caused by the recombination, via the thallium emission center, of free excitons having negative electric charges and a pair of holes having positive electric charges, which are generated by the conversion of incident X-rays in the scintillator. The ghost phenomenon is caused by the retention of positive charges and negative charges in the transport process toward the thallium emission center. The retention is considered to be caused by the crystal lattice defects. Thus, the ghost phenomenon may be suppressed by decreasing the crystal lattice defects.

The [001] orientation of the columnar crystals can be aligned in the direction perpendicular to the surface of the substrate 51 or in a direction close thereto. However, when the columnar crystals are grown using the vacuum deposition method, nothing constrains the crystal rotation around the orientation. Thus, it is difficult to align the [010] orientation of the columnar crystals in a direction parallel to the surface of the substrate 51 or in a direction close thereto. As a result, the [010] orientation in the respective columnar crystals is in a direction different from each other. Accordingly, the columnar crystals different in the [010] orientation from each other coalesce with one another, causing the mismatching of crystal lattice at the interface thereof and in the vicinity of the interface, and thereby, defects (i.e. the lattice defects) are generated in the crystal lattice.

For example, when the columnar crystals have large variation in the crystal orientation as the scintillator 15 according to the comparative example illustrated in FIG. 4, the lattice defects increase corresponding thereto.

In contrast, it is found that the scintillator 5 according to the embodiment illustrated in FIG. 2 has less lattice defects than the scintillator 15 according to the comparative example illustrated in FIG. 4.

For example, when supplying thermal energy to a crystal by heat treatment in order to align the ions adjacent to each other, it is possible to form the continuous structure of unit cells. When the continuous structure of unit cells is formed, the crystal may have a structure close to a single crystal structure without defects. Thus, the lattice defects can be reduced in the film, which is formed to be a scintillator, by applying the heat treatment thereto after the formation process.

However, when the scintillator 15 according to the comparative example, which includes the columnar crystals having different crystal orientations, is subjected to the heat-treated, it may be possible to align the ions therein or partially coarsen the columnar crystals, but the interface cannot be eliminated, which is formed between the columnar crystals coalescing with one another. For this reason, when the scintillator 15 having many interfaces between the columnar crystals coalescing with one another is subjected to the heat treatment, the lattice defects cannot be reduced, which are generated at the interfaces and in the vicinity thereof.

In contrast, since the scintillator 5 according to the embodiment includes few interfaces between the columnar crystals coalescing with one another, there are few lattice defects generated at the interface and in the vicinity thereof. In this case, it is possible to perform the heat treatment in order to correct the crystal strain remaining after the film formation. Thereby, it is possible to make the crystals closer to the perfect crystals. As a result, the ghost phenomenon can be suppressed by the heat treatment performed after the second layer **5*b*** is formed.

For example, when the scintillator 15 according to the comparative example is subjected to the heat treatment, the sensitivity ghost after 60 seconds is 0.014, and the residual rate of sensitivity ghost is 0.45 where the second sensitivity ghost after 5 minutes is divided by the first sensitivity ghost after 1 minute.

In contrast, when the scintillator 5 according to the embodiment is subjected to heat treatment, the sensitivity ghost after 60 seconds is 0.010, and the residual rate of sensitivity ghost is 0.42, where the second sensitivity ghost after 5 minutes is divided by the first sensitivity ghost after 1 minute. Thus, it is possible in the scintillator 5 to suppress the ghost phenomenon.

Furthermore, although the MTF (Modulation Transfer Function) of the scintillator 15 according to the comparative example is about 0.32 to 0.34, the MTF of the scintillator 5 according to the embodiment is improved to be about 0.38 to 0.41.

(Manufacturing Method of Scintillator)

A scintillator forming apparatus 100 can be used for manufacturing the scintillator 5.

Figure 9:
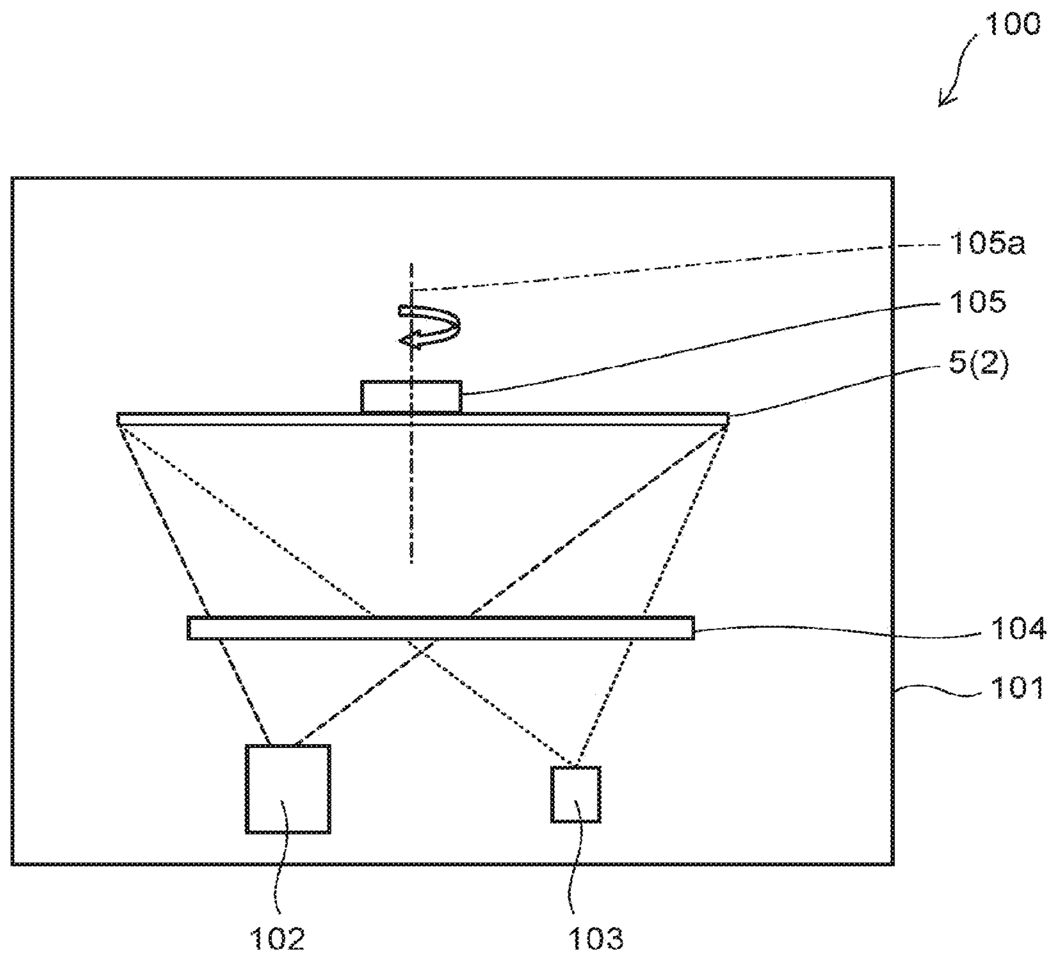
FIG. 9 is a schematic view illustrating an apparatus for forming the scintillator.

FIG. 9 is a schematic view illustrating the scintillator forming apparatus 100.

As shown in FIG. 9, the scintillator forming apparatus 100 is provided with a chamber 101, a first crucible 102, a second crucible 103, a shutter 104, and a rotating mechanism 105.

The first crucible 102, the second crucible 103, and the rotating mechanism 105 are provided in the chamber 101.

A substrate 51 (e.g. an array substrate 2, see FIG. 10) is fixed to the rotating mechanism 105. At this time, the substrate 51 is disposed such that the gravity center of the substrate 51 coincides with the rotation center **105*a*. The rotating mechanism 105 rotates the substrate 51**.

A predetermined amount of cesium iodide is provided in the first crucible 102.

A predetermined amount of thallium is provided in the second crucible 103.

The first crucible 102 and the second crucible 103 are provided at a position facing the substrate 51.

The shutter 104 is provided at a position between the first crucible 102 and the substrate 51 and between the second crucible 103 and the substrate 51.

The scintillator 5 can be manufactured as follows.

A first layer 5*a* is formed on a surface of the substrate 51. That is, the first layer 5*a* containing thallium-activated cesium iodide is formed on the surface of the substrate 51.

For example, gas inside the chamber 101 is evacuated using a vacuum pump (not shown) so that the internal pressure becomes about $5\times10^{-4}$ Pa.

The substrate 51 is rotated by the rotating mechanism 105. At this time, the temperature of the substrate 51 (array substrate 2) is set to 80° C. or lower.

The first crucible 102 and the second crucible 103 are heated by a heating means (not shown). At this time, a temperature of the first crucible 102 is set to be about 700° C. A temperature of the second crucible 103 is set to be about 470° C.

When the cesium iodide provided in the first crucible 102 and the thallium provided in the second crucible 103 are in stable conditions, the shutter 104 is removed. Cesium iodide vapor and thallium vapor are mixed in the space inside the chamber 101, and the mixed vapor reaches the surface of the substrate 51.

In this case, cesium iodide crystals are formed because the vapor amount of cesium iodide is larger than that of thallium. In part of a cesium iodide crystal, a thallium ion is placed at a site, replacing the cesium ion. Thereby, the first layer 5*a* is formed, which contains thallium-activated cesium iodide.

A thickness of the first layer 5*a* can be, for example, several μm or less. Further, the thallium concentration in the first layer 5*a* can be, for example, 0.5 wt % or more. It should be noted that the thallium concentration can be controlled, for example, by suppressing the vapor amount of thallium reaching the substrate 51 using the shutter 104.

Then, the first layer 5*a* is heat-treated. That is, the first layer 5*a* is heated in an environment under a pressure lower than the atmospheric pressure.

The first layer 5*a* is formed without crystallinity, when the temperature of the substrate 51 is 80° C. or lower. Then, the heat treatment is applied to form the columnar crystals aligned in a desired crystal orientation.

The heat treatment applied to the first layer 5*a* can be performed, for example, using a baking furnace provided outside the chamber 101, which is already known.

In this case, the pressure may be set to be about $10^{-3}$ Pa, the heating temperature may be set to be about 120° C. to 200° C., and the heating time may be set to be about 0.5 hour to 5 hours.

In the array substrate 2, a plurality of photoelectric conversion elements 2*b*1 are provided in a region where the first layer 5*a* is formed. For this reason, it is preferable to make the heating temperature lower in the first layer 5*a*.

However, the heating temperature is set to be about 200° C. to 450° C. in the heat treatment generally applied. Thus, there may be a case where the photoelectric conversion element 2*b*1 suffers damage. Moreover, the heat treatment is generally applied at about 200° C. for about 24 hours.

According to the findings by the inventor, it is possible to promote the crystallization by increasing the thallium concentration. That is, it is possible to align the columnar crystals in the desired crystal orientation at a lower temperature by increasing the thallium concentration.

This may relate to the melting point of cesium iodide crystals which is lowered by thallium. In the thallium activated cesium iodide, the melting point of cesium iodide crystals decreases by about 10° C. when the thallium concentration increases by 1 wt %. For example, the melting point is 621° C. in the pure cesium iodide crystal, and the melting point decreases by about 10° C. as the thallium concentration increases by 1 wt %.

According to the findings by the inventor, when the thallium concentration in the first layer 5*a* is 1.2 wt % or more before the heat treatment, it is possible to make the heating temperature 200° C. or less. Moreover, the heating time can be set to be about 5 hours.

It should be noted as described above that the coalescence of columnar crystals is likely to occur in the second layer 5*b*, when the thallium concentration exceeds 3 wt % in the first layer 5*a* after the heat treatment.

In such a case, it is possible to adjust the thallium concentration while heating the first layer 5*a*, since the vapor pressure of thallium is higher than the vapor pressure of cesium iodide. That is, the thallium concentration at the time of forming the first layer 5*a*, i.e. the thallium concentration before the heat treatment is set to be 5 wt % or more in the first layer 5*a*, and the thallium concentration in the first layer 5*a* is adjusted to be 3 wt % or less, preferably 2 wt % or less.

Moreover, when the thallium concentration exceeds 1.5 wt %, the first layer 5*a* exhibits the color change from yellow to orange. When the color of the first layer 5*a* becomes darker, fluorescence generated in the second layer 5*b* is easily absorbed in the first layer 5*a*. When the fluorescence is absorbed in the first layer 5*a*, there may be deterioration of the sensitivity characteristics.

Thus, it is more preferable that the thallium concentration in the first layer 5*a* is 1.5 wt % or less after the heat treatment.

The thallium concentration in the first layer 5*a* after the heat treatment can be controlled by the heating temperature and the heating time.

Then, a second layer 5*b* is formed on the first layer 5*a*.

That is, the second layer 5*b* containing thallium-activated cesium iodide is formed on the first layer 5*a* after the heat treatment.

Similar to the manner of forming the first layer 5*a*, the second layer 5*b* can be formed using the scintillator forming apparatus 100.

The temperature of the substrate 51 can be, for example, 80° C. or lower.

The temperature of the first crucible 102 can be, for example, about 700° C.

The temperature of the second crucible 103 can be, for example, about 410° C.

The second layer 5*b* may have a thickness, for example, about 600 μm.

The thallium concentration in the second layer 5*b* can be, for example, 0.05 wt % or more. As described above, the thallium concentration can be controlled using the shutter 104, for example.

According to the method described above, it is possible to manufacture the scintillator 5 including the first layer 5*a* and the second layer 5*b*.

Further, the scintillator 5 (i.e. the first layer 5*a* and the second layer 5*b*) can be subjected to the heat-treatment.

The heat treatment of the scintillator 5 can be performed, for example, in the atmosphere or in an atmosphere of nitrogen gas. The heat treatment of the scintillator 5 can be performed using, for example, an annealing furnace outside the chamber 101, which is already known.

It is possible to improve the sensitivity ghost after 60 seconds from 0.012 to 0.010 by performing the heat treatment of the scintillator 5. The residual ratio of sensitivity ghost can be improved from 0.52 to 0.42, where the second sensitivity ghost after 5 minutes is divided by the first sensitivity ghost after 1 minute.

(Scintillator and Radiation Detector)

Figure 10:
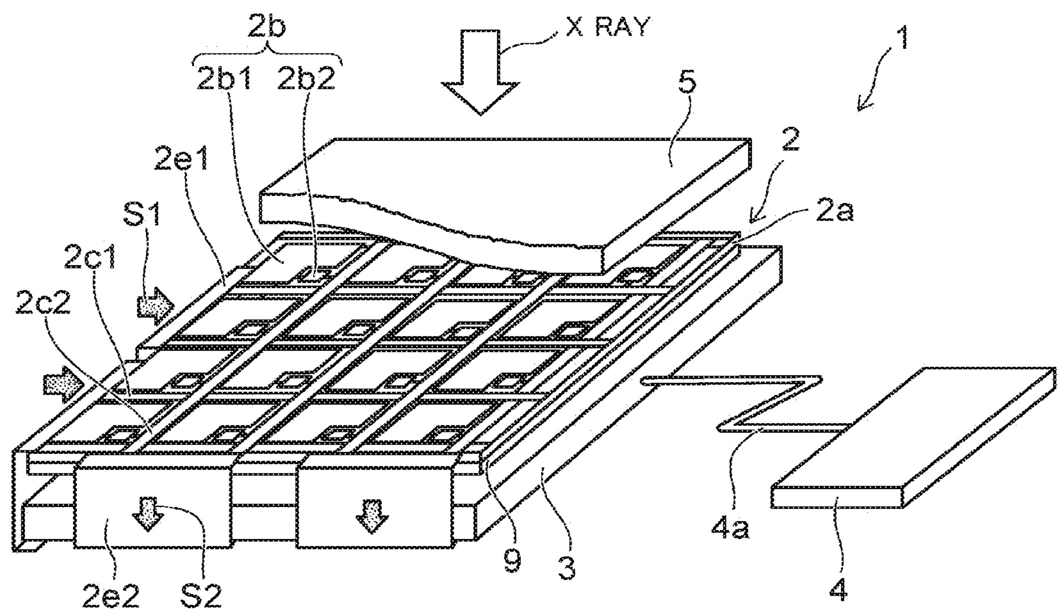
FIG. 10 is a schematic perspective view illustrating an X-ray detector according to the embodiment.

FIG. 10 is a schematic perspective view illustrating the X-ray detector 1 according to the embodiment.

It should be noted that a protective layer 2*f*, a reflective layer 6, a moisture-proof body 7, a bonding layer 8, etc. are omitted for convenience in FIG. 10.

Figure 11:
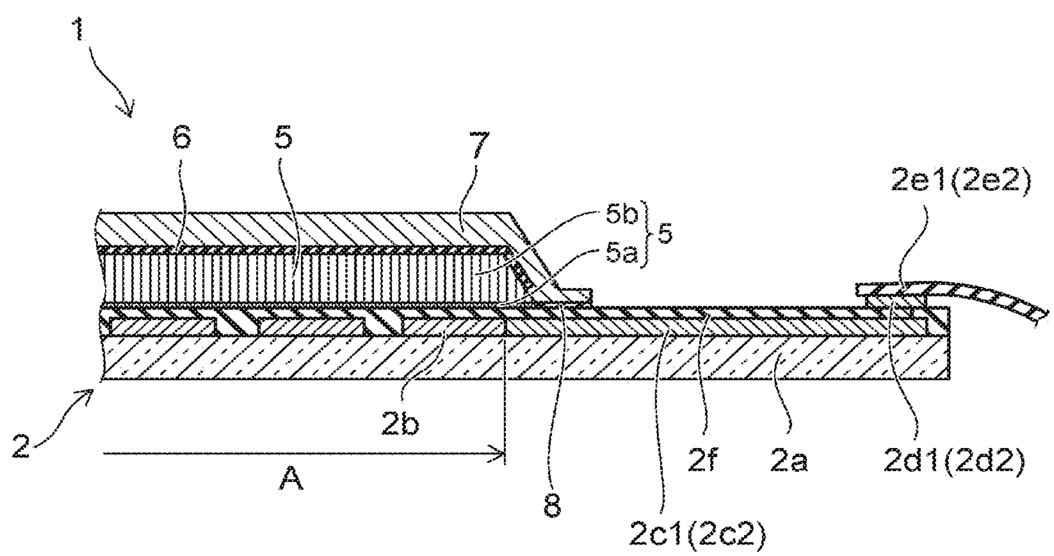
FIG. 11 is a schematic cross-sectional view of the X-ray detector.

FIG. 11 is a schematic cross-sectional view of the X-ray detector 1. It should be noted that a circuit board 3, an image transmission unit 4, etc. are omitted for convenience in FIG. 11.

An X-ray detector 1, which is a radiation detector, is a plane X-ray sensor for detecting an X-ray image that is a radiation image. The X-ray detector 1 can be used, for example, for the general medical applications. Note that the application of the X-ray detector 1 is not limited to the general medical applications.

As shown in FIGS. 10 and 11, the X-ray detector 1 is provided with an array substrate 2, a circuit substrate 3, an image transmission unit 4, a scintillator 5, a reflection layer 6, a moisture-proof body 7, a bonding layer 8, and a support plate 9.

The array substrate 2 includes a substrate 2*a*, a photoelectric conversion portion 2*b*, a control line (or gate line) 2*c*1, a data line (or signal line) 2*c*2, a wiring pad 2*d*1, a wiring pad 2*d*2, and a protective layer 2*f*.

The substrate 2*a* has a plate-like shape and is formed from a translucent material such as alkali-free glass.

A plurality of photoelectric conversion units 2*b* are provided on a surface of the substrate 2*a*.

The photoelectric conversion unit 2*b* has a rectangular shape and is provided in a region defined by a plurality of control lines 2*c*1 and a plurality of data lines 2*c*2. The plurality of photoelectric conversion units 2*b* are arranged in a matrix. Note that each photoelectric conversion unit 2*b* corresponds to one pixel.

The photoelectric conversion unit 2*b* is provided with a photoelectric conversion element 2*b*1 and a thin film transistor (TFT) 2*b*2 which is a switching element.

In the photoelectric conversion unit 2*b*, a storage capacitor (not shown) can be provided for storing the signal charge converted in the photoelectric conversion element 2*b*1.

The photoelectric conversion element 2*b*1 can be, for example, a photodiode.

The thin film transistor 2*b*2 performs switching operation between storage and release of charges generated by fluorescence entering the photoelectric conversion element 2*b*1.

The gate electrode of the thin film transistor 2*b*2 is electrically connected to the corresponding control line 2*c*1. The source electrode of the thin film transistor 2*b*2 is electrically connected to the corresponding data line 2*c*2. The drain electrode of the thin film transistor 2*b*2 is electrically connected to the corresponding photoelectric conversion element 2*b*1 and a storage capacitor (not shown).

The control line 2*c*1 is electrically connected to the wiring pad 2*d*1 provided in the vicinity of periphery of the substrate 2*a*. One of end portions of the flexible printed board 2*e*1 is electrically connected to a plurality of wiring pads 2*d*1. The other of the end portions of the flexible printed board 2*e*1 is electrically connected to a reading circuit (not shown) provided on the circuit board 3.

The data line 2*c*2 is electrically connected to the wiring pad 2*d*2 provided in the vicinity of periphery of the substrate 2*a*. One of end portions of the flexible printed board 2*e*2 is electrically connected to a plurality of wiring pads 2*d*2. The other of the end portions of the flexible printed board 2*e*2 is electrically connected to an amplification/conversion circuit (not shown) provided on the circuit board 3.

The protective layer 2*f* is provided so as to cover the photoelectric conversion portion 2*b*, the control line 2*c*1, and the data line 2*c*2. The protective layer 2*f* can be formed from an insulating material.

The circuit board 3 is provided so as to face the array substrate 2 with the support plate 9 interposed.

A readout circuit (not shown) and an amplification/conversion circuit (not shown) are provided on the circuit board 3.

The read out circuit switches the thin film transistor 2*b*2 between the on state and the off state.

The amplification/conversion circuit includes a plurality of integration amplifiers, a plurality of parallel-serial conversion circuits, and a plurality of analog-to-digital conversion circuits.

An integration amplifier sequentially receives the image data signal S2 from the photoelectric conversion unit 2*b*. The integration amplifier integrates the current flowing in a fixed time and outputs a voltage corresponding to the integrated value to a parallel-serial conversion circuit. The parallel-serial conversion circuit sequentially converts the image data signal S2 into a serial signal, wherein the image data signal S2 is converted into the potential information. An analog-to-digital conversion circuit sequentially converts the image data signal S2 into a digital signal, wherein the image data signal S2 is converted into the serial signal.

The image composing unit 4 is electrically connected to the analog-to-digital conversion circuits provided on the circuit board 3. The image composing unit 4 is electrically connected to the circuit board 3 via the wiring 4*a*. The image composing unit 4 can also be integrated with the circuit board 3.

The image composing unit 4 configures an X-ray image. The image composing unit 4 constructs the X-ray image signal based on the image data signals S2 that are converted into a digital signal by the analog-digital conversion circuit. The X-ray image signal is output from the image composing unit 4 to an external device.

The scintillator 5 is provided so as to cover a region A (e.g. an effective pixel region) provided with a plurality of photoelectric conversion units 2*b* (photoelectric conversion elements 2*b*1) on the substrate 2*a*.

The reflective layer 6 is provided so as to cover the scintillator 5 on the top surface side (i.e. the incident plane side of X-rays). The reflective layer 6 is provided to improve the sensitivity characteristics by enhancing the utilization efficiency of fluorescence. The reflective layer 6 can be formed on the scintillator 5, for example, by coating a resin containing light scattering particles made of titanium oxide ($TiO_2$) or the like.

The moisture-proof body 7 is provided so as to cover the reflective layer 6 and the scintillator 5. The moisture-proof body 7 is provided to suppress degradation of characteristics in the scintillator 5 and the reflective layer 6 by the water vapor contained in the air. The moisture-proof body 7 has a hat shape and can be formed, for example, from an aluminum alloy.

The bonding layer 8 is provided between the flange portion of the moisture-proof body 7 and the substrate 2*a*. The bonding layer 8 can be formed, for example, by curing one of a delayed curing type adhesive (e.g. a UV curing type adhesive in which the curing reaction becomes apparent after a certain period of time after ultraviolet ray irradiation), a natural curing type adhesive (i.e. room temperature curing type), and a heat curing type adhesive.

The support plate 9 is provided between the array substrate 2 and the circuit substrate 3. The array substrate 2 is provided on one side of support plate 9, and the circuit substrate 3 is provided on the other side. The support plate 9 is made of a material that absorbs X-rays such as a lead plate. The support plate 9 is held inside a casing (not shown) that houses the X-ray detector 1.

Not that in FIGS. 1 and 2 shown are examples in which the scintillator 5 is directly formed on the substrate 2*a*.

The scintillator panel 50 aforementioned can also be bonded to the region A of the substrate 2*a* on which the photoelectric conversion units 2*b* are provided. In this case, a surface of the scintillator panel 50 opposite side to the substrate 51 is bonded to the region A. The scintillator panel 50 can be bonded to the region A, for example, using a double-coated optical tape (e.g. an Optical Clear Adhesive Tape), an optical adhesive, or an optical gel.

When the scintillator panel 50 is bonded to the region A, the reflective layer 6 and the moisture-proof body 7 can be omitted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Moreover, above-mentioned embodiments can be combined mutually and can be carried out.

What is claimed is:

1. A scintillator, comprising:

a first layer provided on a surface of a substrate and including thallium activated cesium iodide; and a second layer provided on the first layer and including thallium activated cesium iodide, the second layer including crystals having a [001] orientation partially diverted from a direction perpendicular to the surface of the substrate, wherein half width at half maximum of a frequency distribution curve of an angle between the direction perpendicular to the surface of the substrate and the [001] orientation, which is obtained by measuring the angle using EBSD method, is 2.4 degree or less.

2. The scintillator according to claim 1, wherein a thallium concentration in the first layer is higher than a thallium concentration in the second layer.

3. The scintillator according to claim 1, wherein a thallium concentration in the first layer is 3 wt % or less.

4. The scintillator according to claim 1, wherein a thallium concentration in the first layer is 2 wt % or less.

5. The scintillator according to claim 1, wherein a thallium concentration in the first layer is 1.5 wt % or less.

6. The scintillator according to claim 1, wherein the first layer has a thickness of 3 μm or less.

7. The scintillator according to claim 1, wherein the second layer includes a plurality of columnar crystals.

8. A scintillator panel, comprising:

a substrate being transmissive for radiation; and a scintillator provided on the substrate, wherein:

the scintillator comprises:

a first layer provided on a surface of the substrate and including thallium activated cesium iodide, and a second layer provided on the first layer and including thallium activated cesium iodide, the second layer including crystals having a [001] orientation partially diverted from a direction perpendicular to the surface of the substrate; and half width at half maximum of a frequency distribution curve of an angle between the direction perpendicular to the surface of the substrate and the [001] orientation, which is obtained by measuring the angle using EBSD method, is 2.4 degree or less.

9. The scintillator panel according to claim 8, wherein a thallium concentration in the first layer is higher than a thallium concentration in the second layer.

10. The scintillator panel according to claim 8, wherein a thallium concentration in the first layer is 3 wt % or less.

11. The scintillator panel according to claim 8, wherein a thallium concentration in the first layer is 2 wt % or less.

12. The scintillator panel according to claim 8, wherein a thallium concentration in the first layer is 1.5 wt % or less.

13. The scintillator panel according to claim 8, wherein the first layer has a thickness of 3 μm or less.

14. A radiation detector, comprising:

a substrate including a plurality of photoelectric conversion elements; and the scintillator according to claim 1, the scintillator being provided on a region of the substrate, and the plurality of photoelectric conversion elements being provided in the region.

15. A radiation detector, comprising:

a substrate including a plurality of photoelectric conversion elements; and the scintillator panel according to claim 8, the scintillator panel being provided on a region of the substrate, and the plurality of photoelectric conversion elements being provided in the region.

* * * * *

UNITED STATES PATENT AND TRADEMARK OFFICE

CERTIFICATE OF CORRECTION

PATENT NO. : 10,386,505 B2
APPLICATION NO. : 15/643909
DATED : August 20, 2019
INVENTOR(S) : Atsuya Yoshida et al.

It is certified that error appears in the above-identified patent and that said Letters Patent is hereby corrected as shown below:

On the Title Page

Item (71), the Applicant's name is incorrect. Item (71) should read:
-- (71) Applicant: CANON ELECTRON TUBES & DEVICES CO., LTD., Otawara-shi (JP) --

Signed and Sealed this
Seventh Day of January, 2020

Andrei Iancu
*Director of the United States Patent and Trademark Office*